(12) United States Patent
Ko et al.

(10) Patent No.: US 8,530,277 B2
(45) Date of Patent: Sep. 10, 2013

(54) INTEGRATED CIRCUIT PACKAGING SYSTEM WITH PACKAGE ON PACKAGE SUPPORT AND METHOD OF MANUFACTURE THEREOF

(75) Inventors: ChanHoon Ko, Incheon (KR); SangJin Lee, Seongnam-si (KR)

(73) Assignee: STATS ChipPAC Ltd., Singapore (SG)

( * ) Notice: Subject to any disclaimer, the term of this patent is extended or adjusted under 35 U.S.C. 154(b) by 119 days.

(21) Appl. No.: 13/162,526

(22) Filed: Jun. 16, 2011

(65) Prior Publication Data
US 2012/0319284 A1 Dec. 20, 2012

(51) Int. Cl.
*H01L 21/00* (2006.01)

(52) U.S. Cl.
USPC ............ 438/109; 257/E21.503; 257/686; 257/777; 438/637; 438/675

(58) Field of Classification Search
CPC ..................................... H01L 23/48
USPC ............ 257/E21.502, E21.503, E23.01, 257/E23.023, 686, 685, 690, 723, 773, 777, 257/790; 438/109, 127, 637, 667, 668, 675
See application file for complete search history.

(56) References Cited

U.S. PATENT DOCUMENTS

| | | | |
|---|---|---|---|
| 6,638,792 B2 * | 10/2003 | Hui et al. | 438/118 |
| 6,828,665 B2 * | 12/2004 | Pu et al. | 257/686 |
| 6,861,288 B2 * | 3/2005 | Shim et al. | 438/109 |
| 7,456,495 B2 * | 11/2008 | Pohl et al. | 257/686 |
| 7,589,408 B2 * | 9/2009 | Weng et al. | 257/686 |
| 7,679,178 B2 * | 3/2010 | Pu et al. | 257/686 |
| 7,687,315 B2 * | 3/2010 | Carson | 438/109 |
| 7,723,159 B2 * | 5/2010 | Do et al. | 438/113 |
| 7,755,180 B2 * | 7/2010 | Yim et al. | 257/686 |
| 7,787,250 B2 * | 8/2010 | Li et al. | 361/715 |
| 7,919,360 B1 * | 4/2011 | Camacho et al. | 438/123 |
| 7,919,871 B2 * | 4/2011 | Moon et al. | 257/777 |
| 7,952,176 B2 * | 5/2011 | Pagaila et al. | 257/676 |
| 7,977,780 B2 * | 7/2011 | Tay et al. | 257/686 |
| 8,018,040 B2 * | 9/2011 | Jang et al. | 257/686 |
| 8,030,748 B2 * | 10/2011 | Ye et al. | 257/686 |
| 8,076,770 B2 * | 12/2011 | Kagaya et al. | 257/698 |
| 8,080,446 B2 * | 12/2011 | Choi et al. | 438/109 |
| 8,115,293 B2 * | 2/2012 | Moon et al. | 257/686 |
| 8,124,451 B2 * | 2/2012 | Song et al. | 438/109 |
| 8,169,058 B2 * | 5/2012 | Pagaila et al. | 257/629 |
| 2007/0181990 A1 * | 8/2007 | Huang et al. | 257/686 |
| 2007/0241437 A1 * | 10/2007 | Kagaya et al. | 257/678 |
| 2007/0290376 A1 | 12/2007 | Zhao | |
| 2008/0227238 A1 * | 9/2008 | Ko et al. | 438/108 |
| 2009/0115043 A1 * | 5/2009 | Chow et al. | 257/686 |
| 2009/0236752 A1 * | 9/2009 | Lee et al. | 257/777 |
| 2010/0148344 A1 * | 6/2010 | Chandra et al. | 257/690 |

(Continued)

OTHER PUBLICATIONS

U.S. Appl. No. 13/405,523, filed Mar. 10, 2010, Ko et al.

(Continued)

*Primary Examiner* — Chris Chu
(74) *Attorney, Agent, or Firm* — Ishimaru & Associates LLP; I-Chang John Yang (57) ABSTRACT

A method of manufacture of an integrated packaging system includes: providing a substrate; mounting a die over the substrate; mounting an interposer having a slot over the die; covering a first encapsulant over the die and the interposer, a central region of the interposer exposed from the first encapsulant; and forming a hole through the first encapsulant to expose a peripheral portion of the interposer.

15 Claims, 4 Drawing Sheets

(56) References Cited

U.S. PATENT DOCUMENTS

2011/0260334 A1* 10/2011 Hasegawa .................... 257/774

OTHER PUBLICATIONS

Dreiza, Moody et al., Package on Package (PoP) Stacking and Board Level Reliability, Results of Joint Industry Study, May 9, 2006, pp. 8, Publisher: ECTC 56th, Published in: US.

Kim, Jinseong et al., Application of Through Mold Via (TMV) as PoP Base Package, May 12, 2008, pp. 4, Publisher: ECTC 58$^{th}$, Published in: US.

Yoshida, Akito et al., A Study on Package Stacking Process for Package-on-Package (PoP), pp. 6 Publisher: IMAPS, Published in: US.

* cited by examiner

INTEGRATED CIRCUIT PACKAGING SYSTEM WITH PACKAGE ON PACKAGE SUPPORT AND METHOD OF MANUFACTURE THEREOF

TECHNICAL FIELD

The present invention relates generally to an integrated circuit packaging system, and more particularly to a system for an integrated circuit packaging system with package on package support.

BACKGROUND ART

Current semiconductor packaging technology often involves tradeoffs between ease and efficiency of manufacturing on the one hand, and various performance drawbacks on the other. For example, a tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

There is an important need that exists for parts in the package to become thinner and thinner to reduce the size of the whole package effectively without sacrificing performance and speed. Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in art.

DISCLOSURE OF THE INVENTION

The present invention provides a method of manufacture of an integrated circuit packaging system including: providing a substrate; mounting a die over the substrate; mounting an interposer having a slot over the die; covering a first encapsulant over the die and the interposer, a central region of the interposer exposed from the first encapsulant; and forming a hole through the first encapsulant to expose a peripheral portion of the interposer.

The present invention provides an integrated circuit packaging system including: a substrate; a die over the substrate; an interposer having a slot over the die; and a first encapsulant over the die and the interposer having a hole through the first encapsulant to expose a peripheral portion of the interposer, a central region of the interposer exposed from the first encapsulant.

Certain embodiments of the invention have other steps or elements in addition to or in place of those mentioned above. The steps or elements will become apparent to those skilled in art from a reading of the following detailed description when taken with reference to accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of an integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

The term "package-on-package" ("PoP") as used herein includes packaging of devices, where each of the packages can be packaged and tested separately, and then stacked together in package form, wherein at least one package rests on top of another.

The term "Fan-In Package-on-Package" ("FiPoP") as used herein making connections between packages by means of a center ball array instead of a peripheral ball array, thereby decoupling the size of the top package from that of the bottom package.

Figure 1:
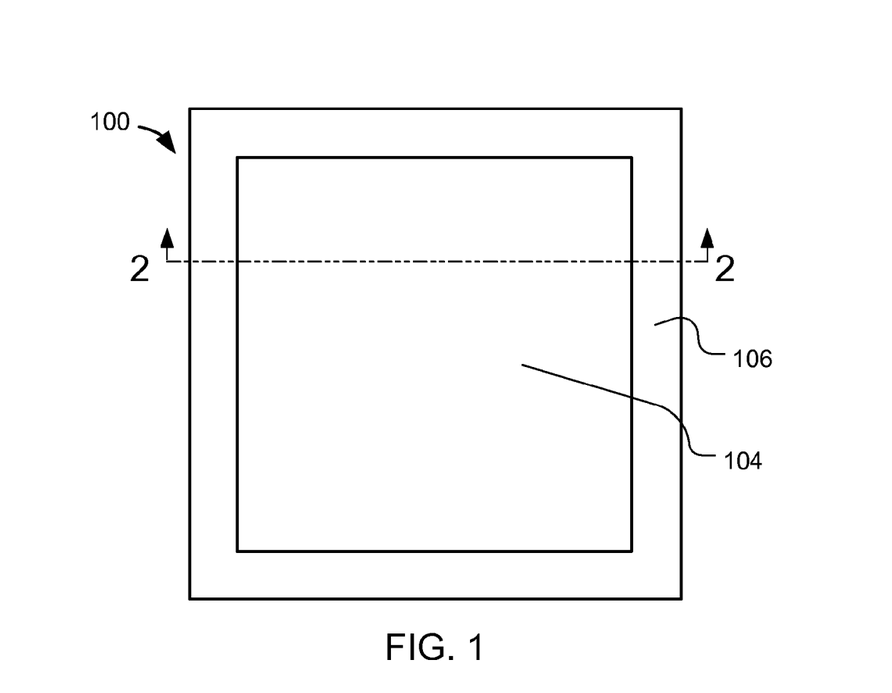
FIG. 1 is a top view of an integrated circuit packaging system in a first embodiment of the present invention.

Referring now to FIG. 1, therein is shown a top view of an integrated circuit packaging system 100 in a first embodiment of the present invention. The top plan view depicts the integrated circuit packaging system 100 having a top package 104 and a bottom package 106. The top package 104 is mounted on top of the bottom package 106 as shown. The top package 104 and the bottom package 106 can be arranged in a PoP configuration or a FiPoP configuration.

The top package 104 is defined as an integrated circuit device. For example, the top package 104 can be an encapsulated integrated circuit assembly or a packaged integrated circuit. The top package 104 can contain at least an integrated circuit therein, where the package contains at least one set of interconnects on the bottom of the package. The bottom package 106 is defined as an encapsulated integrated circuit assembly containing at least an integrated circuit therein, where the package contains at least one set of interconnects on the top of the package.

Figure 2:
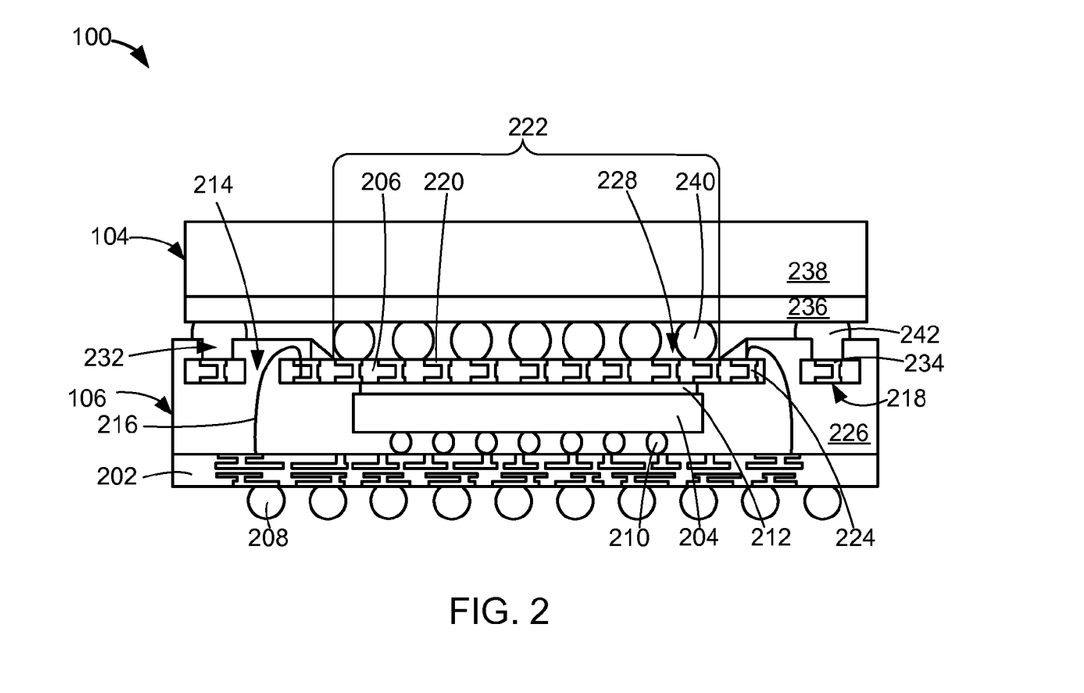
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The bottom package 106 can include a first substrate 202, a first die 204, and an interposer 206. The first substrate 202 is defined as a chip carrier, such as a laminated substrate or a ceramic substrate. The first substrate 202 can have external interconnects 208. The external interconnects 208 are defined as interconnects electrically connected to the first substrate 202 for electrically connecting to other circuits and electrical systems.

The first die 204 can be mounted over the first substrate 202. The first die 204 is defined as a block of material, on which a given functional circuit is fabricated. The first die 204 can be an unpackaged integrated circuit. The first die 204 can have die interconnects 210 for electrically connecting the first die 204 to the first substrate 202. The die interconnects 210 are defined as conductive structures for routing electrical power or signals, such as wires, solder bumps, solder balls, or conductive pillars.

The interposer 206 can be mounted over the first die 204. The interposer 206 is defined as a substrate having conductive paths therein for making electrical connections between two sides of the substrate. The interposer 206 can be electrically connected to the first die 204. The interposer 206 can also be electrically connected to the first substrate 202.

The interposer 206 can be attached to the first die 204 with an adhesive 212. The adhesive 212 is defined as a material that attaches surfaces together. The adhesive 212 can be, for example, a wire-in-film adhesive, an adhesive tape, an epoxy adhesive, or an underfill adhesive.

The interposer 206 can include slots 214. The slots 214 are defined as apertures within the interposer 206. First interconnects 216 can be attached from the interposer 206 through the slots 214 to the first substrate 202 for making electrically connections. The first interconnects 216 are defined as conductive structures for routing electrical power or signals, such as wires or cables. The first interconnects 216 can be attached on a surface of the first substrate 202 through the slots 214 to a surface of the interposer 206.

It has been discovered the interposer 206 having the slots 214 for attaching the first interconnects 216 from the interposer 206 through the slots 214 to the first substrate 202 provides increased reliability for the integrated packaging system 100. The slots 214 allow for attachment of the first interconnects 216 without sacrificing the size of the interposer 206. If the interposer 206 can have a larger size when the slots 214 are used, a peripheral portion 218 of the interposer 206 can act as an attachment surface for metal-to-metal supporting structures. Extra supporting structures increases package reliability. Accordingly, the interposer 206 having the slots 214 increases package reliability for the present invention.

A number of central pads 220 can be exposed on a central region 222 of the interposer 206 for making electrical connections. The central pads 220 are defined as conductive plates or slabs of the interposer 206 having exposed surfaces. The term "central" is used to describe the central region 222 and the central pads 220 of the invention as an example, and does not limit the central pads 220 to being only at the center. The central pads 220 can be embedded within the interposer 206 such that a top surface of the central pads 220 is coplanar with a top surface of the interposer 206. The central pads 220 can be electrically connected to vias 224 within the interposer 206 to route electrical power or signals to other portions and surfaces of the interposer 206. The vias 224 are defined as holes in the interposer 206 filled with conductive material for conducting electrical current from one area of the interposer 206 to another.

The bottom package 106 can include a first encapsulant 226. The first encapsulant 226 is defined as a protective cover for the bottom package 106, such as a molding compound or an epoxy compound. The first encapsulant 226 can be applied to cover over at least partially the interposer 206, the first die 204, and the first substrate 202. The first encapsulant 226 can have a recess 228 exposing the central region 222 of the interposer 206. The recess 228 can be a concavity on a surface of the first encapsulant 226. The recess 228 can have a shape of a truncated cone or a truncated pyramid.

A hole 232 can be formed in the first encapsulant 226 exposing the peripheral portion 218 of the interposer 206. The hole 232 can be a partial aperture from a surface of the first encapsulant 226 to expose the interposer 206 within the first encapsulant 226. The hole 232 can be formed away from the recess 228. The hole 232 can be formed by a through mold via (TMV) process. TMV is the application of solder vias through a bottom package mold cap, such as a mold cap of the bottom package 106. The hole 232 can be cylindrical, rectangular, conic, truncated conic, or semi-elliptical.

The peripheral portion 218 of the interposer 206 adjacent and along a perimeter of the interposer 206 have support pads 234 thereon. The support pads 234 are defined as conductive plates or slabs on or within the interposer 206 having exposed surfaces to route electrical power or signals to other portions of the interposer 206. The support pads 234 can be electrically connected to the central pads 220 by the vias 224 or traces. The support pads 234 are along the peripheral portion 218 of the interposer 206. The hole 232 can expose one of the support pads 234 from the first encapsulant 226. The hole 232 can also expose only one of the support pads 234 from the first encapsulant 226 without exposing other portions of the interposer 206.

The top package 104 of the integrated circuit packaging system 100 can include a second substrate 236 and a second encapsulant 238 over the second substrate 236. The second encapsulant 238 is defined as a protective cover for the top package 104. The second substrate 236 is defined as a carrier structure such as a laminated substrate or a ceramic substrate. The second substrate 236 can have package interconnects 240. The package interconnects 240 are defined as conductive structures electrically connected to the second substrate 236 for electrically connecting the second substrate 236 to the bottom package 106. The package interconnects 240 can connect to the bottom package 106 through the central region 222 of the interposer 206 of the bottom package 106. For example, the package interconnects 240 can be solder balls or conductive pillars.

The second substrate 236 can also have a supporter 242. The supporter 242 is defined as a conductive structure for making electrical connections and providing physical support of the top package 104 including during and after encapsulation. The supporter 242 can be formed on the second substrate 236, and mounted on the bottom package 106 along with the top package 104.

The supporter 242 can be aligned over one of the support pads 234 in the peripheral portion 218 of the interposer 206. The supporter 242 can be made from a solder ball, a solder bump, conductive post, metal column, or a conductive paste. The supporter 242 can be reflowed to completely fill the hole 232 and make electrical connection on the peripheral portion 218 of the interposer 206. The supporter 242 can have a volume greater than a volume of the hole 232 such that it protrudes out of the hole 232 and can overflow onto the second encapsulant 238.

An underfill (not shown) can be injected in between the top package 104 and the bottom package 106 filling the recess 228 of the first encapsulant 226 and surrounding the package interconnects 240. The underfill can also partially or completely surround the supporter 242. The underfill is defined as an insulating filler material for protecting interconnects within a gap between packages.

Figure 3:
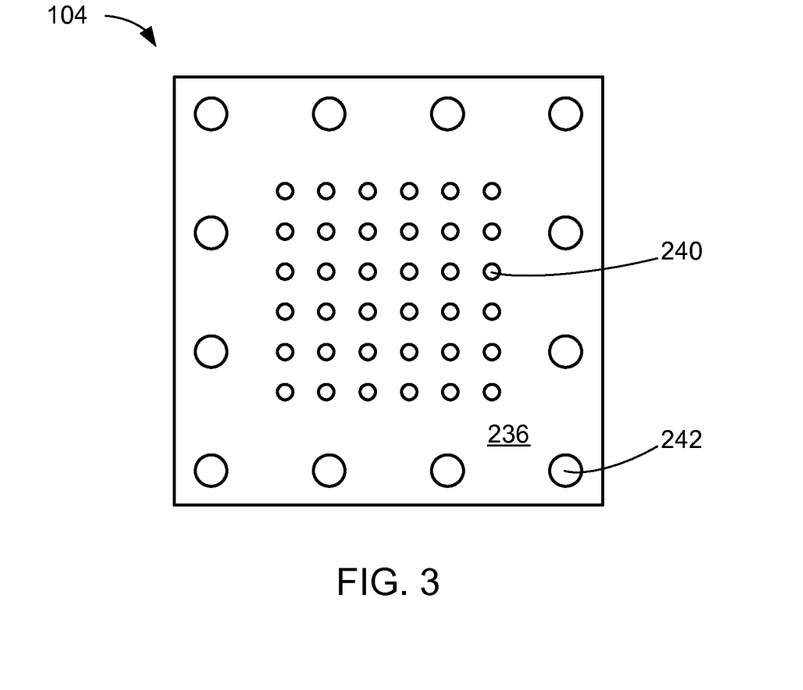
FIG. 3 is a bottom view of the top package.

Referring now to FIG. 3, therein is shown a bottom view of the top package 104. For example, the bottom view of the top package 104 shows the second substrate 236 having a number of the supporter 242 mounted thereon as well as a number of the package interconnects 240. The package interconnects 240 can be arranged in a matrix pattern as shown. The number of the supporter 242 can be arranged adjacent to and along a perimeter of the second substrate 236.

The size of the package interconnects 240 can be different. For example, the size of the package interconnects 240 can progressively increase from an interior area towards a peripheral area of the second substrate 236.

Figure 4:
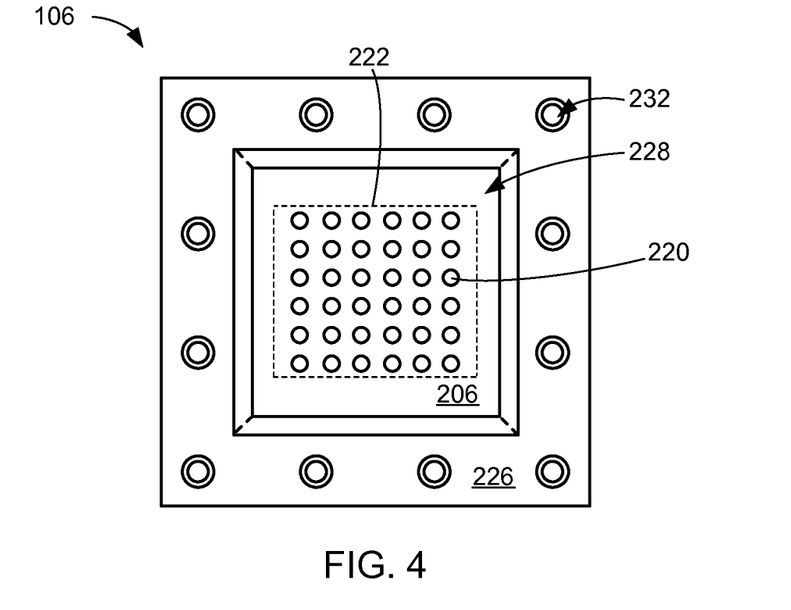
FIG. 4 is a top view of the bottom package.

Referring now to FIG. 4, therein is shown a top view of the bottom package 106. For example, the top view of the bottom package 106 is shown with the first encapsulant 226 exposing the support pads 234 in the peripheral portion 218 of FIG. 2 of the interposer 206 through the hole 232 and exposing the central region 222 of the interposer 206 through the recess 228. For example, the recess 228 is shown as a truncated pyramid having a sloped perimeter. A number of the central pads 220 can be exposed on the central region 222 of the interposer 206 for making electrical connections with the package interconnects 240 of FIG. 2.

The size of the central pads 220 can be different. For example, the size of the central pads can progressively increase from an interior area towards a peripheral area of the interposer 206.

Figure 5:
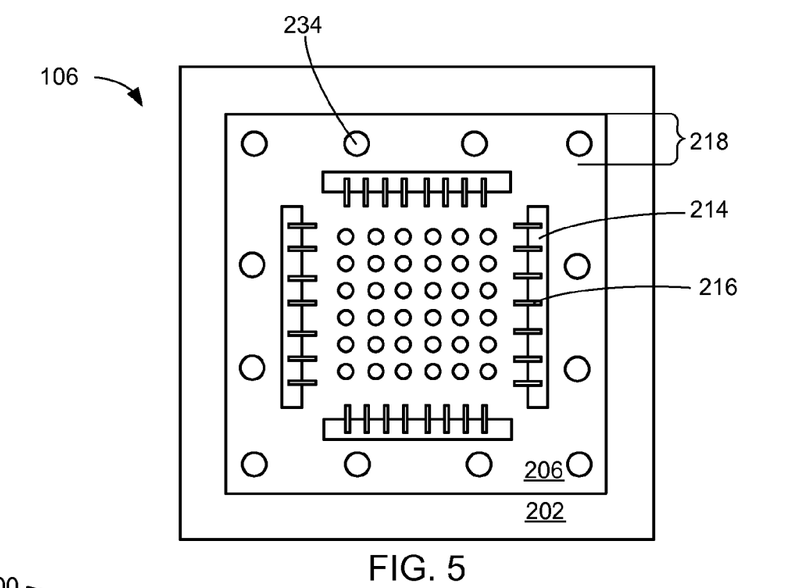
FIG. 5 is a top plan view of the bottom package without a portion of the first encapsulant of FIG. 4.

Referring now to FIG. 5, therein is shown a top plan view of the bottom package 106 without a portion of the first encapsulant 226 of FIG. 4. The bottom package 106 includes the first substrate 202 and the interposer 206 having the slots 214 mounted on the first substrate 202. The first interconnects 216 can be attached to a surface of the interposer 206 and a surface of the first substrate 202 through the slots 214 of the interposer 206. The peripheral portion 218 of the interposer 206 along a perimeter of the interposer 206 can have the support pads 234 thereon.

Figure 6:
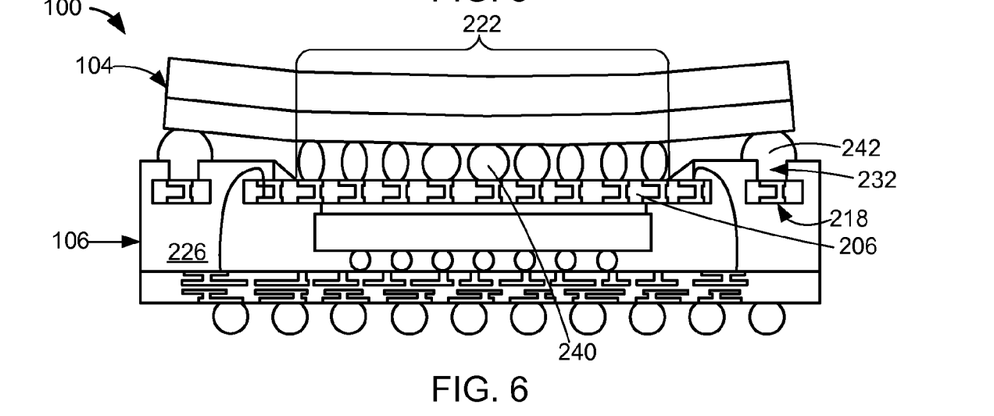
FIG. 6 is an example of a cross-sectional view of the integrated circuit packaging system along line 2-2 of FIG. 1 under warpage.

Referring now to FIG. 6, therein is shown an example of a cross-sectional view of the integrated circuit packaging system 100 along line 2-2 of FIG. 1 under warpage. FIG. 6 shows the top package 104, under warpage, mounted on top of the bottom package 106. Warpage can occur due to differences in coefficient of thermal expansion (CTE), or other characteristics of materials in a package. Warpage can create unreliable solder joints, such as open joints or weak joints.

For example, the top package 104 is shown to have a concave warpage. However, it is understood that the top package 104 can also undergo a convex warpage. Under warpage, the package interconnects 240 are shown to be either compressed or elongated. Under the concave warpage, the package interconnects 240 are shown to be compressed towards the central region 222 of the interposer 206 and elongated in a vertical direction away from the central region 222 of the interposer 206.

It has been discovered forming the hole 232 through the first encapsulant 226 to expose the peripheral portion 218 of the interposer 206 provides increases Board Level Reliability (BLR)/drop test performance of the integrated circuit packaging system 100. The hole 232 through the first encapsulant 226 allows for the supporter 242 to make metal to metal connection at the area of fan-out for better joint strength. Better joint strength increases BLR/drop test performance. Accordingly, forming the hole 232 through the first encapsulant 226 to expose the peripheral portion 218 of the interposer 206 increases drop test performance of the present invention.

Figure 7:
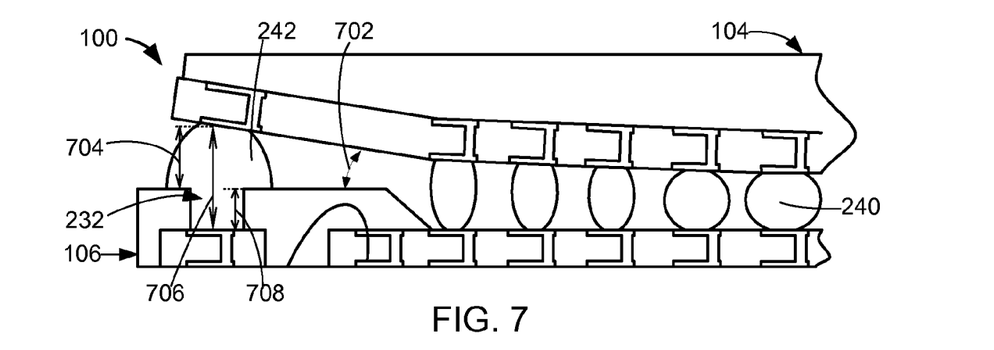
FIG. 7 is an enlarged view of FIG. 6 near the supporter.

Referring now to FIG. 7, therein is shown an enlarged view of FIG. 6 near the supporter 242. FIG. 7 shows the top package 104 mounted on top of the bottom package 106 under warpage. Warpage can be quantified by a warp angle 702 or a warp height 704. The warp angle 702 is defined as the angle between a top surface of the bottom package 106 and a bottom surface of the top package 104 near a peripheral extent of the top package 104.

The warp height 704 is defined as the height between a top surface of the bottom package 106 and a bottom surface of the top package 104 near a peripheral extent of the top package 104 during warpage. For example, the warp height 704 can be measured from a top surface of the bottom package 106 to the point on the bottom surface of the top package 104 directly above a center point of the hole 232. Without warpage, the separation between the top package 104 and the bottom package 106 is minimal, and the warp height 704 would be minimal as well. The warp height 704 and the warp angle 702 can be measured and observed through experimentation or approximation based on the geometry of the top package 104, the bottom package 106, or both, reflow temperature, and thermal expansion coefficients of materials used in the packages.

FIG. 7 also shows, as an example, a supporter height 706 equal to the warp height 704 plus a hole height 708 of the hole 232. The supporter height 706 is defined as a length measured along a vertical dimension of the supporter 242 from a highest point of the supporter 242 in direct contact with the top package 104 to a lowest point of the supporter 242. For example, the supporter height 706 can be a major diameter of the supporter 242 if the supporter 242 has an ellipsoid, spherical, or egg shape.

The hole height 708 is defined as a length measured along a vertical dimension of the hole 232. Where the supporter 242 is a solder ball, the supporter height 706 can be a vertical diameter of the supporter 242. As an example, the supporter height 706 is shown to be larger than the warp height 704, and the supporter 242 is shown to be larger in volume than each of the package interconnects 240.

It has been unexpectedly found that controlling the supporter height 706 of the supporter 242 according to the warp height 704 between the top package 104 and the bottom package 106 provides a more stable and reliable package mount process for the integrated packaging system 100. The supporter 242 can reinforce overall package joint strength if the package is under warpage, and make sure there is still electrical contact between joints of the top package 104 and the bottom package 106. Hence if the supporter height 706 is controlled to equal to the warp height 704 plus the hole height 708, then the present invention will have a more stable and reliable package mount process due to increased joint strength.

Figure 8:
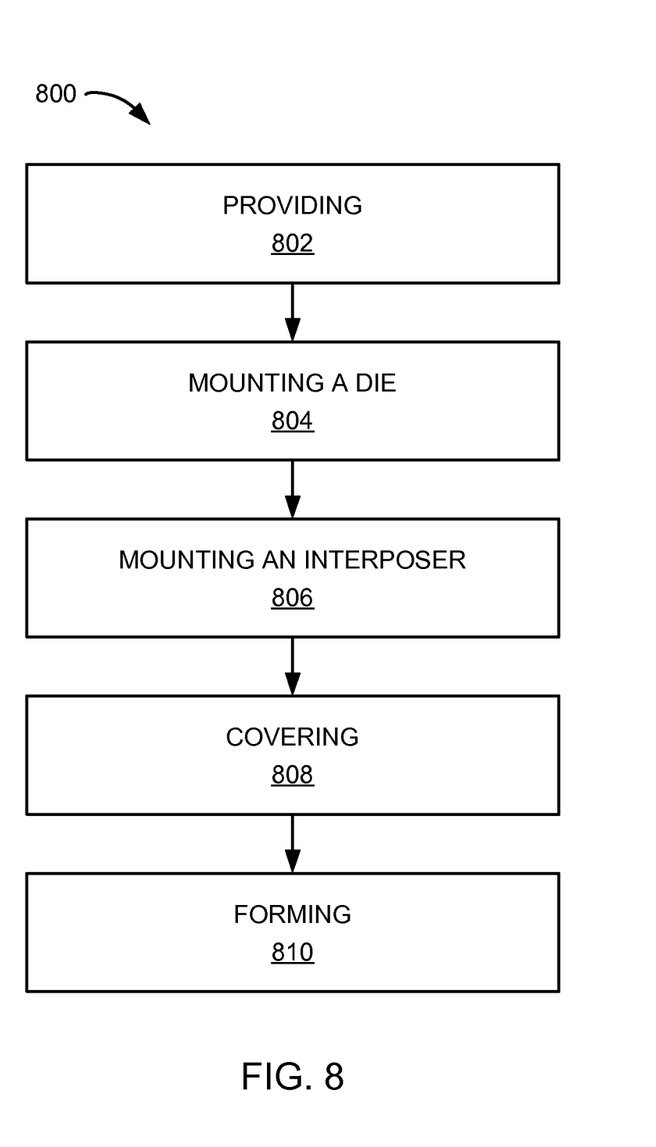
FIG. 8 therein is a flow chart of a method of manufacture of the integrated circuit packaging system in a further embodiment of the present invention.

Referring now to FIG. 8 therein is shown a flow chart of a method 800 of manufacture of the integrated circuit packaging system 100 in a further embodiment of the present invention. The method 800 includes: providing a substrate, in a block 802; mounting a die over the substrate, in a block 804; mounting an interposer having a slot over the die, in a block 806; covering a first encapsulant over the die and the interposer, a central region of the interposer exposed from the first encapsulant, in a block 808; and forming a hole through the first encapsulant to expose a peripheral portion of the interposer, in a block 810.

The resulting method, process, apparatus, device, product, and system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in art in light of aforegoing description. Accordingly, it is intended to embrace all such alternatives, modifications, and variations that fall within the scope of the included claims. All matters hithertofore set forth herein or shown in accompanying drawings are to be interpreted in an illustrative and non-limiting sense.

What is claimed is:

1. A method of manufacture of an integrated circuit packaging system comprising:
   providing a substrate;
   mounting a die over the substrate;
   mounting an interposer having a slot over the die;
   covering a first encapsulant over the die and the interposer, a central region of the interposer exposed from the first encapsulant;
   forming a hole through the first encapsulant to expose a peripheral portion of the interposer; and
   mounting a top package having a package interconnect and a supporter over and in direct contact with the interposer, the supporter larger than the package interconnect.

2. The method as claimed in claim 1 wherein the supporter has a supporter height greater than a warp height between a top surface of the first encapsulant and a bottom surface of the top package directly above the hole.

3. The method as claimed in claim 1 further wherein the supporter has a supporter height over the interposer, the supporter height equal to a warp height between a top surface of the first encapsulant and a bottom surface of the top package directly above the hole plus a hole height of the hole.

4. The method as claimed in claim 1 further comprising:
   attaching the supporter to the peripheral portion of the interposer through the hole.

5. A method of manufacture of an integrated circuit packaging system comprising:
   providing a substrate;
   mounting a die over the substrate;
   mounting an interposer having a slot over the die;
   covering a first encapsulant over the die and the interposer, a central region of the interposer exposed from the first encapsulant;
   mounting a top package having a supporter over the interposer;
   attaching the supporter to a peripheral portion of the interposer through a hole of the first encapsulant;
   attaching a first interconnect from the interposer through the slot to the substrate, and wherein:
   covering the first encapsulant includes covering the first encapsulant over the interposer and within the slot.

6. The method as claimed in claim 5 wherein attaching the supporter includes attaching the supporter having a volume greater than a volume of the hole.

7. The method as claimed in claim 5 wherein the central region of the interposer is exposed from a recess of the first encapsulant away from the hole.

8. An integrated circuit packaging system comprising:
   a substrate;
   a die over the substrate;
   an interposer having a slot over the die; and
   a first encapsulant over the die and the interposer having a hole through the first encapsulant to expose a peripheral portion of the interposer, a central region of the interposer exposed from the first encapsulant; and
   a top package having a package interconnect and a supporter over and in direct contact with the interposer, the supporter larger than the package interconnect.

9. The system as claimed in claim 8 wherein the supporter having has a supporter height greater than a warp height between a top surface of the first encapsulant and a bottom surface of the top package directly above the hole.

10. The system as claimed in claim 8 wherein the supporter has a supporter height over the interposer, the supporter height equal to a warp height between a top surface of the first encapsulant and a bottom surface of the top package directly above the hole plus a hole height of the hole.

11. The system as claimed in claim 8 wherein the supporter is attached to the peripheral portion of the interposer through the hole of the first encapsulant.

12. The system as claimed in claim 11 wherein the supporter has a volume greater than a volume of the hole.

13. The system as claimed in claim 11 wherein the first encapsulant exposes the central region of the interposer from a recess of the first encapsulant away from the hole.

14. The system as claimed in claim 11 further comprising:
   a first interconnect extending from the interposer through the slot to the substrate; and wherein:
   the first encapsulant is within the slot.

15. The system as claimed in claim 11 wherein the first encapsulant having the hole includes the hole being cylindrical.

* * * * *